United States Patent
Wang et al.

(10) Patent No.: US 6,822,259 B1
(45) Date of Patent: Nov. 23, 2004

(54) METHOD OF DETECTING AND DISTINGUISHING STACK GATE EDGE DEFECTS AT THE SOURCE OR DRAIN JUNCTION

(75) Inventors: Zhigang Wang, Santa Clara, CA (US); Nian Yang, San Jose, CA (US); Xin Guo, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 31 days.

(21) Appl. No.: 10/126,193

(22) Filed: Apr. 19, 2002

(51) Int. Cl.[7] .......................... H01L 23/58; G01R 31/26; G11C 29/00
(52) U.S. Cl. .......................... 257/48; 324/537; 324/765; 324/769; 365/201
(58) Field of Search .......................... 257/48; 438/11, 438/14, 17, 18; 365/185, 201; 324/537, 765–769

(56) References Cited

U.S. PATENT DOCUMENTS 4,841,482 A * 6/1989 Kreifels et al. ........ 365/185.22

2003/0074152 A1 * 4/2003 Kessenich et al. .......... 702/117

* cited by examiner

*Primary Examiner*—Nathan J. Flynn
*Assistant Examiner*—Johannes Mondt

(57) ABSTRACT

A method and apparatus for testing semiconductors comprising stacked floating gate structures. A floating gate is programmed (710). An electrical stress or disturb voltage is applied to a control gate with a source and a drain in a specific set of conditions (720). Subsequent to the stressing, a drain current versus gate voltage relationship is measured (730). The sequence of programming, stressing and measuring may be repeated (740) with different conditions for source and drain. More particularly, positive and negative biases are applied to a source while a drain is held at ground, and similar biases are applied to a drain while a source is held at ground. Through inspection of the measurement information taken after this sequence of stress applications, a stack gate edge-defect may be identified (750) as associated with a source edge or a drain edge. In this novel manner, stack gate edge defects may be identified and localized via non-destructive means, and corrective actions to the semiconductor manufacturing process and/or the partially manufactured wafer may be taken.

4 Claims, 9 Drawing Sheets

METHOD OF DETECTING AND DISTINGUISHING STACK GATE EDGE DEFECTS AT THE SOURCE OR DRAIN JUNCTION

TECHNICAL FIELD

Embodiments of the present invention relate to semiconductor process control, reliability and testing. More particularly, embodiments of the present invention provide a method of detecting and distinguishing stack gate edge defects at the source or drain junction.

BACKGROUND ART

Flash memory is a type of semiconductor computer memory with many desirable characteristics. Like read only memory, ROM, it is non-volatile, meaning that the contents of the memory are stable and retained without applied electrical power.

A major advantage of flash over ROM is that the memory contents of flash may be changed after the device is manufactured. However, flash memory generally can not be written to, or programmed, at rates comparable to random access memory, RAM. Further, flash generally must be erased, either in its entirety or in large segments called pages, prior to changing its contents.

Flash memory has found wide acceptance in many types of computers, including desktop computers, mobile phones and hand held computers. Flash memory is also widely used in digital cameras and portable digital music players, for example "MP3" players.

In addition to direct flash storage applications, for example in video cameras, flash-based storage devices are replacing rotating magnetic disks, sometimes known as hard drives, in many applications. Compared to hard drives, flash is significantly more rugged, quieter, lower power, and for some densities such a flash based device may be smaller than a comparable hard drive.

As discussed above, a page of flash memory generally must be erased before new data may be stored in that page. Erasing a page is generally a long process, typically measured in hundreds of milliseconds. This is a disadvantage compared to RAM and hard drives, which may be written directly, without an interposing erasure.

For reasons of cost improvement, increasing speed of operation, power consumption decreases and other well known reasons, the semiconductor industry is pushing the semiconductor process geometry of flash memory devices to ever smaller sizes. A typical size of the smallest feature on a chip is, for example, 0.26 μm. As flash memory devices are designed for this and smaller geometries, a "channel" erase scheme is necessary for NOR-type flash devices. With channel erasure at such small process geometries, erase currents flow not only through the channel of the semiconductor device, but also through source and drain edges.

In an ideal case, erasure is controlled by the channel region device. Unfortunately, imperfections in the semiconductor manufacturing process may lead to defects in the stack gate edge. Such defects may occur, for example, in process steps such as stack gate etch, Self-Aligned-Source (SAS) and reverse SAS. There may be over 100 process steps involved; some may affect the source, while others may affect the drain. Such defects may in turn lead to erratic and/or fast erase bits in an array of flash memory cells. Consequently, it is critical to identify the location of such defects.

A widely used, well known industry standard inspection method is to examine sections of a semiconductor wafer with a tunneling electron microscope, TEM, to measure the thickness of the various layers, for example, polysilicon, oxide, metalization, etc. Unfortunately, stack gate errors may occur in any cell within an integrated circuit. Inspect of such defects with a TEM requires pre-knowledge of their location, and hence another means of detection. In addition, it is generally very difficult to slice the cross section in exactly the right spot, e.g., a single flash memory cell, to actually inspect such a defect. Consequently, TEM is generally of no value in inspecting semiconductors for stack gate defects.

What is highly sought in the industry, then, is a fast, non-destructive method of testing flash memory devices for stack gate defects.

SUMMARY OF THE INVENTION

A method and apparatus for testing semiconductors comprising stacked floating gate structures are disclosed. A floating gate is programmed. An electrical stress or disturb voltage is applied to a control gate with a source and a drain in a specific set of conditions. Subsequent to the stressing, a drain current versus gate voltage relationship is measured. The sequence of programming, stressing and measuring may be repeated with different conditions for source and drain. More particularly, positive and negative biases are applied to a source while a drain is held at ground, and similar biases are applied to a drain while a source is held at ground. Through inspection of the measurement information taken after this sequence of stress applications, a stack gate edge defect may be identified as associated with a source edge or a drain edge. In this novel manner, stack gate edge defects may be identified and localized via non-destructive means, and corrective actions to the semiconductor manufacturing process and/or the partially manufactured wafer may be taken.

BEST MODE FOR CARRYING OUT THE INVENTION

In the following detailed description of the present invention, method of detecting shallow trench isolation corner thinning by electrical stress, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

METHOD OF DETECTING AND DISTINGUISHING STACK GATE EDGE DEFECTS AT THE SOURCE OR DRAIN JUNCTION

Embodiments of the present invention are described in the context of semiconductor processing and testing. However, it is appreciated that embodiments of the present invention may be utilized in other areas of process quality inspection.

Figure 1:
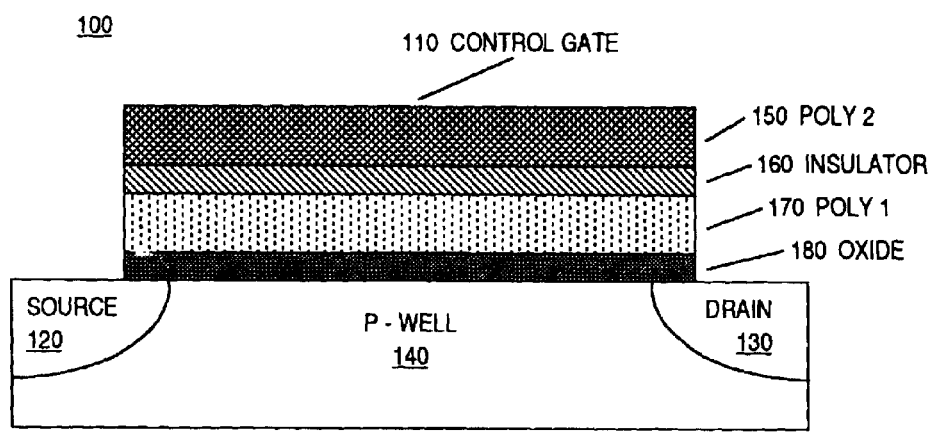
FIG. 1 is an illustration of a cross sectional view of a metal oxide semiconductor (CMOS) device, according to an embodiment of the present invention.

FIG. 1 is an illustration of a cross sectional view of a metal oxide semiconductor (MOS) device 100, according to an embodiment of the present invention. More particularly, MOS structure 100 is a single cell of a floating gate flash (electrically erasable programmable read only memory, or EEPROM) memory device. Floating gate device 100 comprises an N-channel transistor with an electrically isolated poly-silicon floating gate 170 Electrical access to the floating gate is through an effective capacitor network of surrounding $SiO_2$ layers (180 and 160) and source 120, drain 130, transistor channel 140, and poly-silicon layer 150 comprising control gate terminal 110. Any charge present on the floating gate 170 is retained due to the inherent Si—$SiO_2$ energy barrier leading to the non-volatile nature of the memory cell. Characteristic of the structure is a thin tunneling oxide 180 of approximately 100 Å. It is to be appreciated that floating gate device 100 may comprise more layers and/or additional structures in accordance with embodiments of the present invention.

Figure 2:
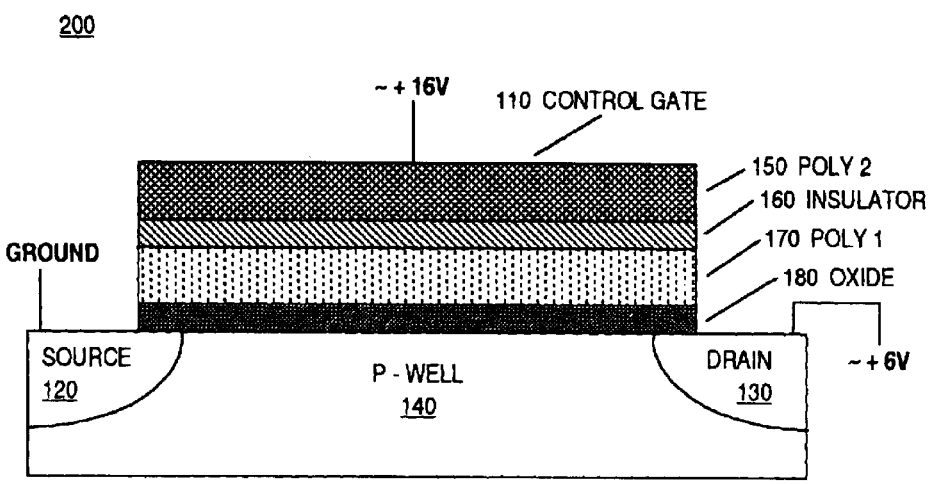
FIG. 2 illustrates the bias conditions necessary to program a floating gate device, according to an embodiment of the present invention.

One operation to be performed by floating gate device 100 is storing information. This is accomplished by programming the cell. In order to program floating gate device 100, electrons must be added to the floating gate 170. FIG. 2 illustrates the bias conditions 200 necessary to program floating gate device 100, according to an embodiment of the present invention. Source 120 is grounded while drain 130 is connected to approximately six volts. Control gate 110 receives a high voltage of approximately 16 volts. By the hot electron injection mechanism, electrons are added to floating gate 170.

Figure 3:
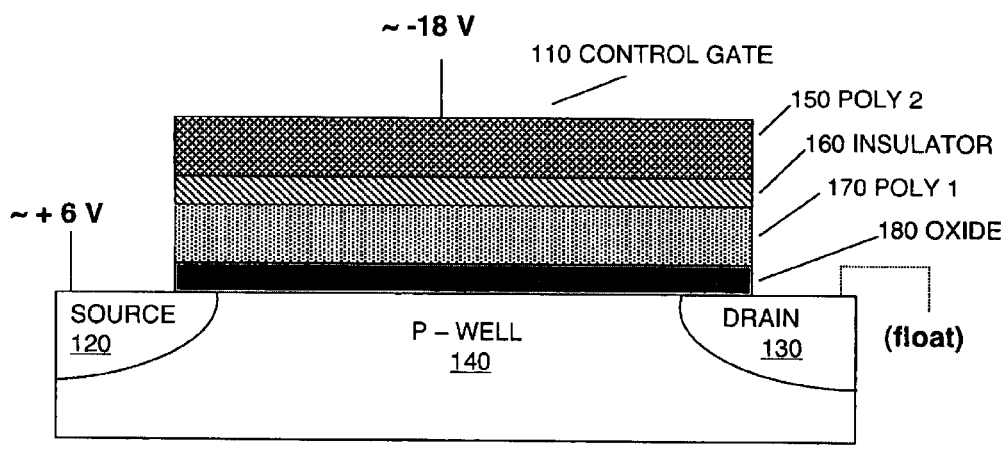
FIG. 3 illustrates the bias conditions necessary to erase a floating gate device, according to an embodiment of the present invention.

Another attribute of flash memory is the ability to electrically erase contents of the memory device. In order to erase the contents of flash cell 100, electrons must be removed from floating gate 170. FIG. 3 illustrates the bias conditions 300 necessary to erase floating gate device 100, according to an embodiment of the present invention. Drain 130 is left floating. Source 120 is connected to approximately 6 volts. Control gate 110 is given a high negative bias, on the order of −18 volts. Under the bias conditions shown in FIG. 3, the electrical erase of flash device 100 takes place via the quantum-mechanical effect of Fowler-Nordheim Tunneling.

An actual flash memory device is usually composed of arrays of individual cells, for example cell 100. Because of the physical size of an individual cell in modem semiconductor manufacturing, it is generally impractical to observe most electrical properties of an individual cell. Consequently, exemplary empirical information presented herein will generally deal with an array of hundreds of thousands of individual cells. It is to be appreciated that discussions of individual cell features are used as an aid to understanding the present invention, and that generally voltages are applied, for example, to all similar structures within an array.

Figure 4:
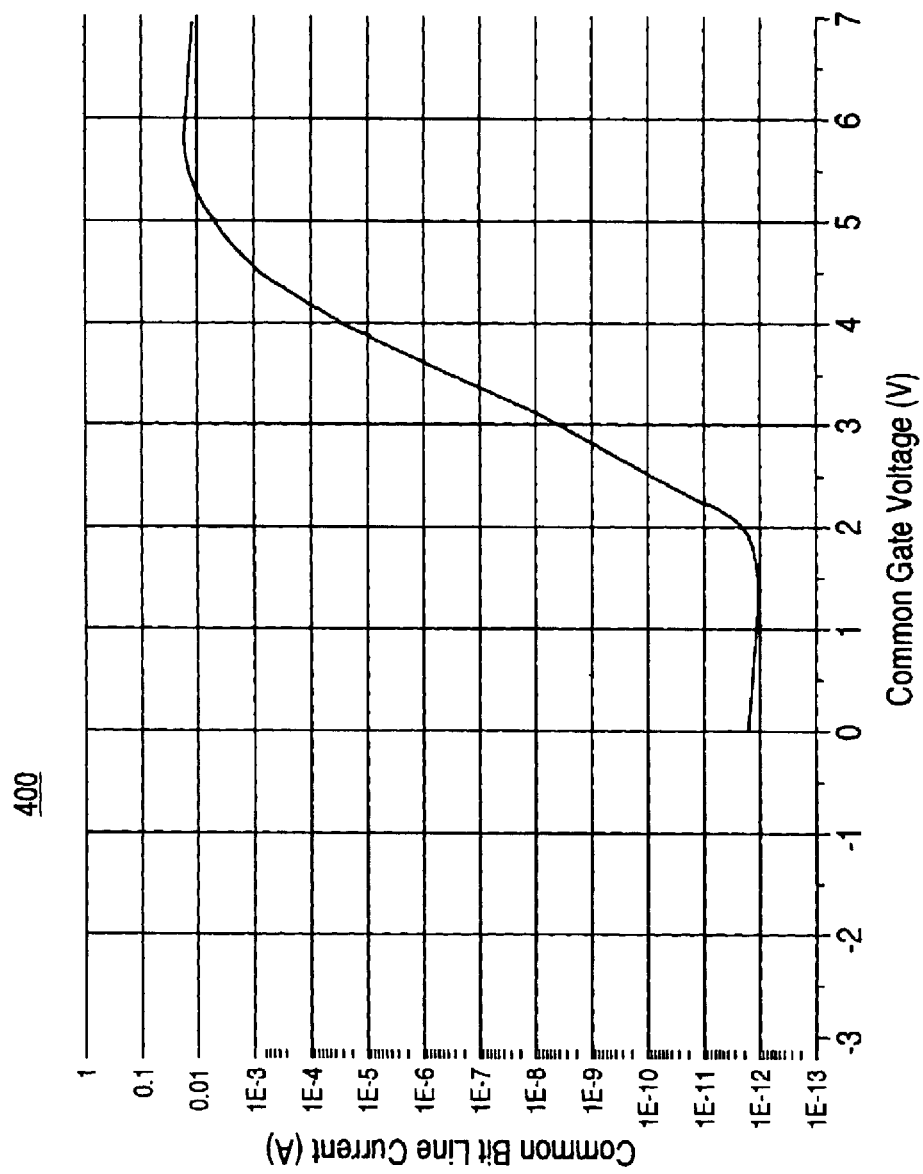
FIG. 4 shows a graph of drain current versus gate voltage, according to an embodiment of the present invention.

FIG. 4 shows a graph 400 of drain 130 current versus gate 10 voltage, according to an embodiment of the present invention. Graph 400 is constructed by collecting data from an array of floating gate devices, for example device 100, after they have been programmed. Drain 130 is given a low voltage of approximately 0.5 volts, source 120 and well 140 are grounded and an applied voltage at gate 110 is swept from low voltage, for example −3 volts, to higher voltages, for example 7 volts.

Graph 400 represents the erase behavior of floating gate 100. A simplified interpretation of graph 400 is that it measures the number of electrons coming off of floating gate 170 for the given voltage. Ideally, graph 400 should represent the "left" half of a normal distribution with a small standard deviation.

Figure 5:
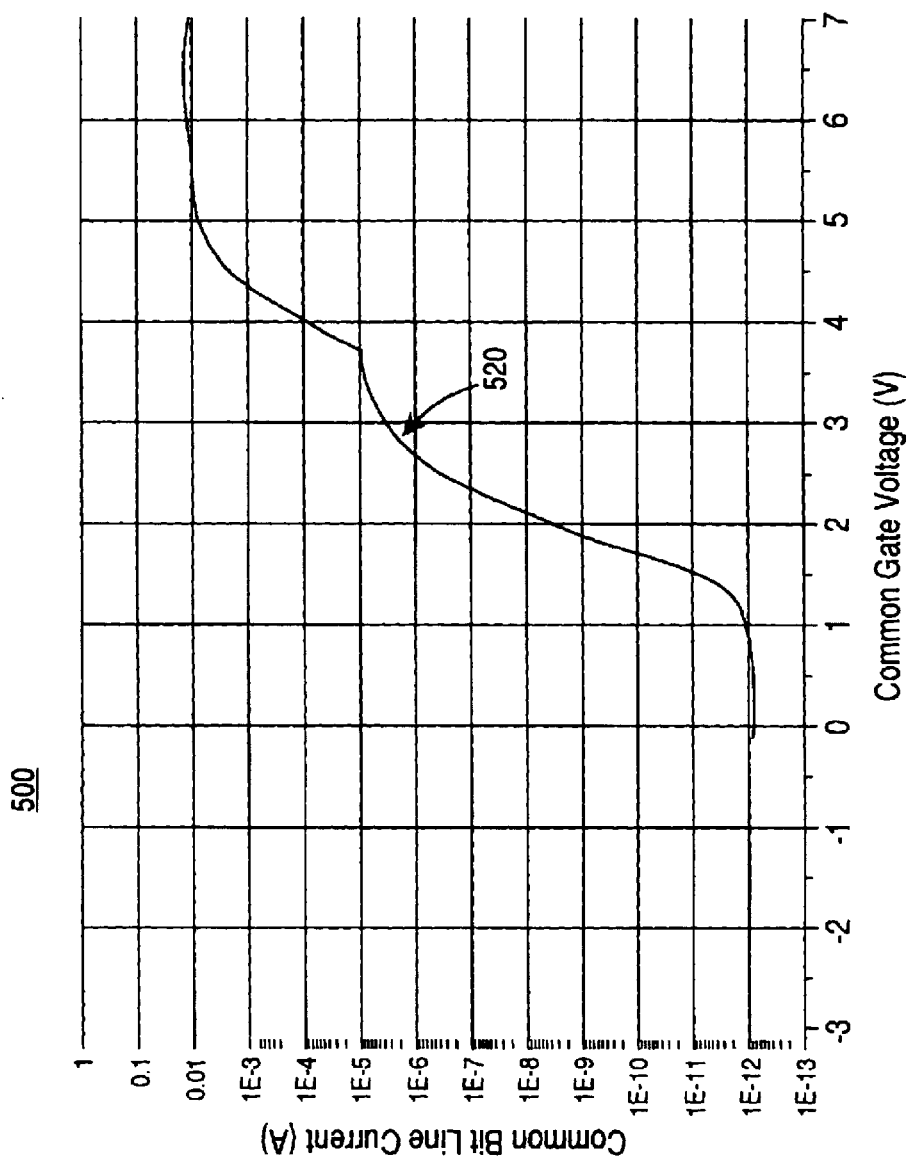
FIG. 5 shows a graph of drain current versus gate voltage, according to an embodiment of the present invention.

Under certain circumstances, a graph of drain current versus gate voltage after programming made under similar conditions to those of graph 400 may deviate from the ideal form of graph 400. Graph 500 of FIG. 5 shows a graph 500 of drain 130 current versus gate 110 voltage, according to an embodiment of the present invention. More particularly, graph 500 has a "knee" 520 that deviates from idealized behavior as shown in graph 400. Graph 500 indicates that electrons are coming off of floating gate 170 at lower voltages than desired. Flash memory cells exhibiting this behavior may be said to erase "fast." For example, electrons tunnel off of floating gate 170 (FIG. 1) at a lower voltage than desired. Such fast erasure may lead to data retention difficulties and a lack of reliability in data retention and erasing, and is generally undesirable.

Figure 6:
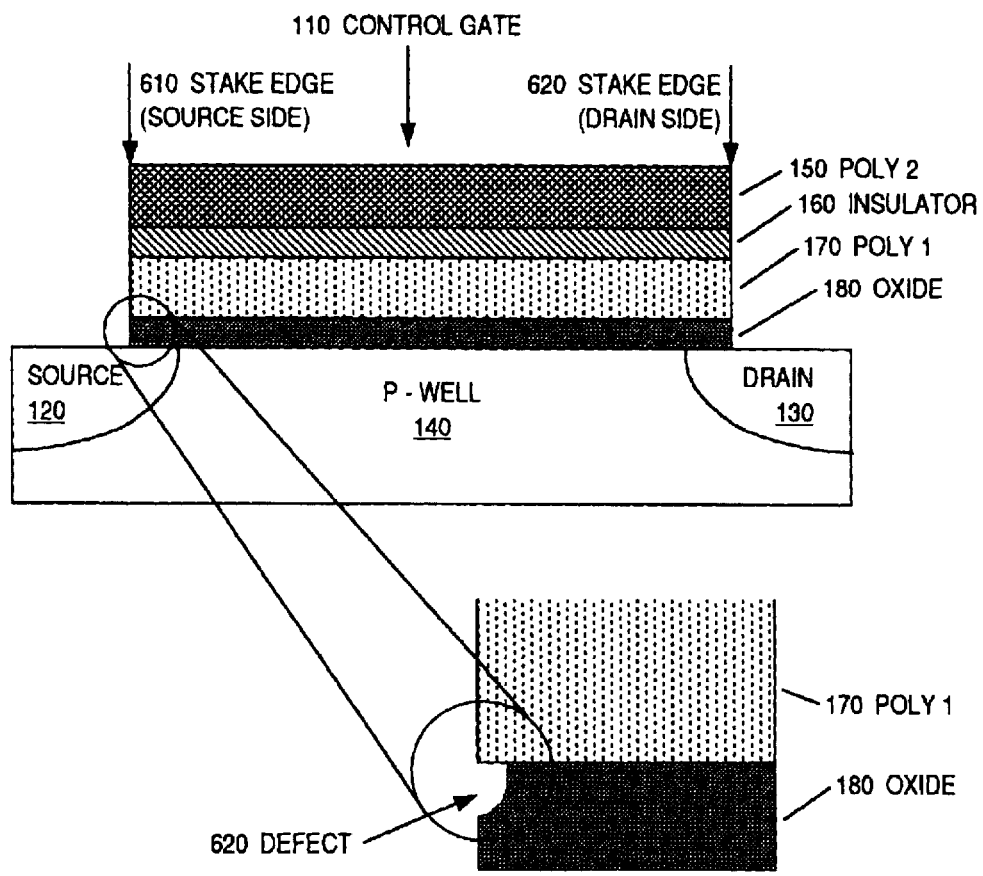
FIG. 6 shows an enlargement of an exemplary stack gate edge defect, according to an embodiment of the present invention.

One likely cause of such fast erasing is defects in the stack gate edge. FIG. 6 illustrates a stack gate edge (source side) 610 of floating gate device 100 and a stack gate edge (drain side) 620. FIG. 6 further shows an enlargement of an exemplary stack gate edge defect 620, according to an embodiment of the present invention. Defects in tunnel oxide 180 such as defect 620 may be caused by a number of factors, including etching, implantation, and/or oxidation which may occur during the semiconductor manufacturing process. Defects in tunnel oxide 180 may serve to reduce the Fowler-Nordheim energy barrier, resulting in "faster" or lower voltage erasure. It is to be appreciated that, even though graphs presented herein represent the collective behavior of many thousands of cells, a single defect in one cell may result in a distribution shift as exemplified by knee 520 (FIG. 5), according to an embodiment of the present invention.

In order to make adjustments to a manufacturing process to improve the rate of defects and/or to actually repair such defects, it is necessary to identify the location of the defect. More particularly, it is desirable to determine whether a stack edge defect is on the source side of a stack or on the drain side of a stack. Knowledge of a location of a defect may influence corrective actions taken to a manufacturing process and/or a semiconductor wafer itself.

Figure 7:
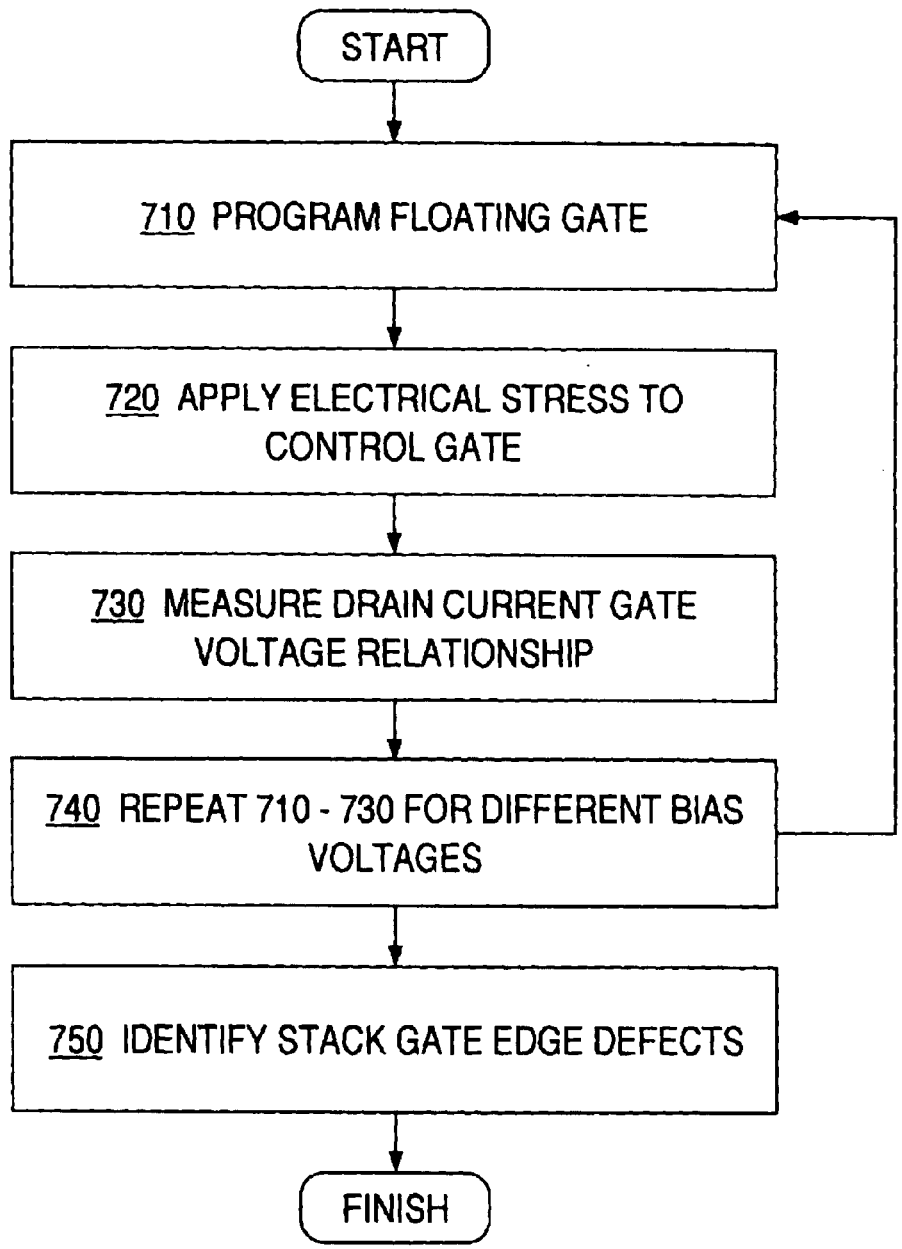
FIG. 7 shows a flow chart illustrating a method of testing a semiconductor, according to an embodiment of the present invention.

FIG. 7 shows a flow chart illustrating a method 700 of testing a semiconductor, according to an embodiment of the present invention. In step 710, a floating gate is programmed as described above (FIG. 2). In step 720, an electrical stress voltage is applied to a control gate. The voltage value is chosen to disturb the charge on the floating gate, but to be less than the erase and program voltages normally used to erase and program the device, for example negative 14 volts. The stress voltage is applied for a period of time, for example 5 mS. Preferably, the combination of voltage and application time is chosen such that the bulk of the drain current gate voltage distribution is not affected or shifted by the stress voltage. It is appreciated that other voltages applied for differing period of time are well suited to embodiments of the present invention.

In step 730, a drain current gate voltage relationship is measured as described above (FIG. 4). Optional step 740 causes steps 710 through 730 to be repeated with different bias voltages applied to the source and/or the drain during step 720. Table 1 below shows an exemplary set of conditions that may identify a gate stack edge defect as being associated with either a drain side or a source side.

TABLE 1

| Stress Number | Source Condition | Drain Condition |
| --- | --- | --- |
| 1 | ground | ground |
| 2 | +1 volt | ground |
| 3 | −1 volt | ground |
| 4 | ground | +1 volt |
| 5 | ground | −1 volt |

It is to be appreciated that different bias voltages and different sequences of stress conditions are well suited to embodiments of the present invention.

In optional step 750 a stack gate edge defect may be identified as associated with a source side if drain current gate voltage relationships determined after electrical stress application with a drain grounded show different behavior. For example, if a drain current gate voltage relationship taken in step 730 for condition 2 differs from a drain current gate voltage relationship taken in step 730 for condition 3, then a gate stack defect associated with a source is identified.

Likewise, optional step 750 may identify a gate stack defect associated with a drain via a complementary analysis. For example, if a drain current gate voltage relationship taken in step 730 for condition 4 differs from a drain current gate voltage relationship taken in step 730 for condition 5, then a gate stack defect associated with a drain is identified. It is to be appreciated that embodiments of the present invention are well suited to identifying gate stack defects located at both source and drain edges.

Figure 8:
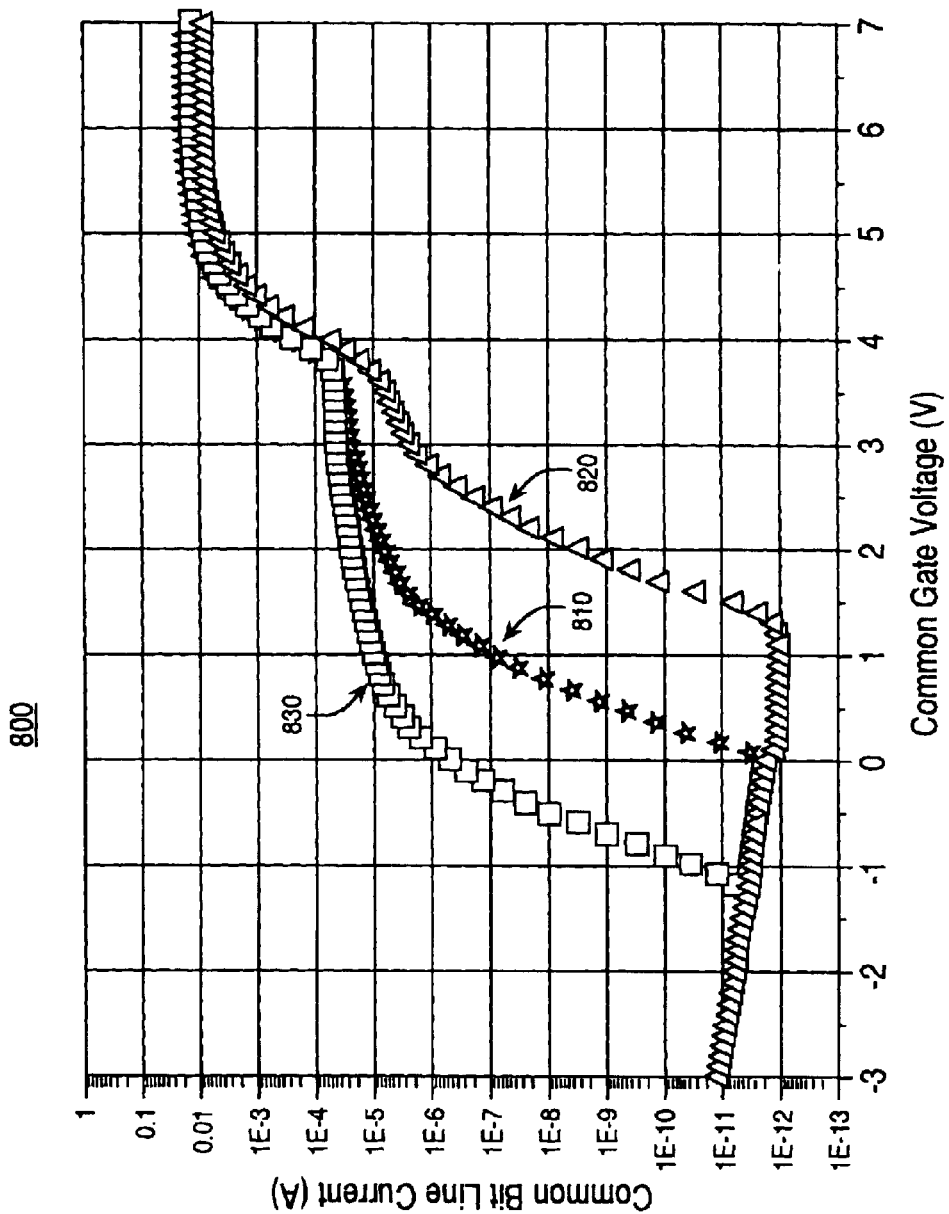
FIG. 8 shows a graph 800 of drain current versus gate voltage for an array of floating gate memory cells, according to an embodiment of the present invention.
Figure 9:
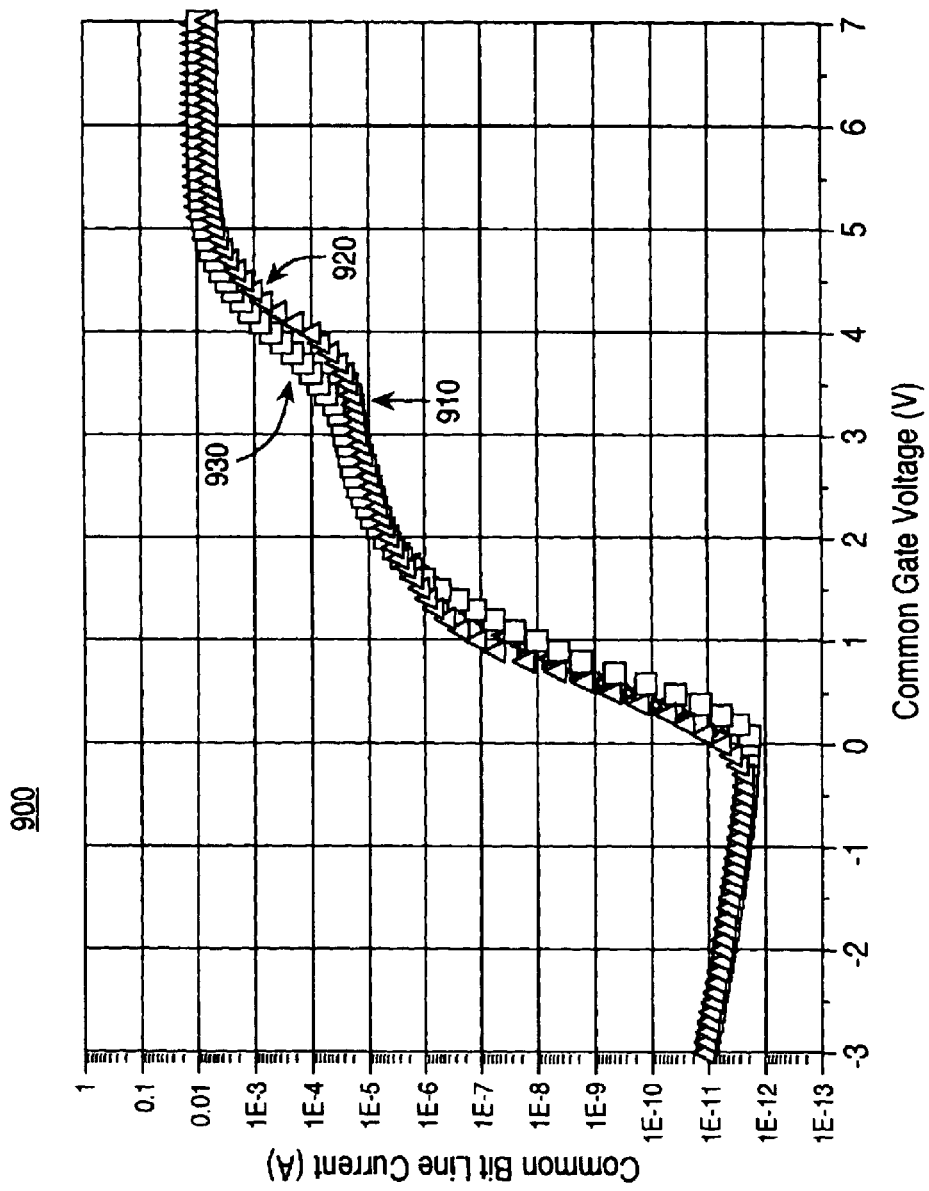
FIG. 9 shows a graph of drain current versus gate voltage for an array of floating gate memory cells, according to an embodiment of the present invention.

FIGS. 8 and 9 show graphs of experimental drain current gate voltage data, according to an embodiment of the present invention. FIG. 8 shows a graph 800 of drain current versus gate voltage for an array of floating gate memory cells, according to an embodiment of the present invention. Curve 810 was obtained after the array was programmed, and an electrical stress of −14 volts was applied to the control gate for 5 mS. During the stress, the source and drain were grounded. This corresponds to stress condition number 1 in Table 1, above.

Curve 820 was obtained after the array was programmed, and an electrical stress of −14 volts was applied to the control gate for 5 mS. During the stress, the drain was grounded, while the source was held at a bias of negative one volt relative to the drain. This corresponds to stress condition number 3 in Table 1, above. Curve 830 was obtained after the array was programmed, and an electrical stress of −14 volts was applied to the control gate for 5 mS. During the stress, the drain was grounded, while the source was held at a bias of positive one volt relative to the drain. This corresponds to stress condition number 1 in Table 1, above.

From inspection of graph 800, curves 810, 820 and 830 are distinct, indicating that a bias applied to the source has an effect on the drain current control gate voltage relationship. More particularly, a larger potential difference between source and drain during the stress or disturb event results in more bits erasing at lower gate voltages. Consequently, according to an embodiment of the present invention, a source edge defect has been identified.

FIG. 9 shows a graph 900 of drain current versus gate voltage for an array of floating gate memory cells, according to an embodiment of the present invention. Curve 910 was obtained after the array was programmed, and an electrical stress of −14 volts was applied to the control gate for 5 mS. During the stress, the source and drain were grounded. This corresponds to stress condition number 1 in Table 1, above.

Curve 920 was obtained after the array was programmed, and an electrical stress of −14 volts was applied to the control gate for 5 mS. During the stress, the source was grounded, while the drain was held at a bias of negative one volt relative to the source. This corresponds to stress condition number 5 in Table 1, above. Curve 930 was obtained after the array was programmed, and an electrical stress of −14 volts was applied to the control gate for 5 mS. During the stress, the source was grounded, while the drain was held at a bias of positive one volt relative to the source. This corresponds to stress condition number 4 in Table 1, above.

From inspection of graph 900, curves 910, 920 and 930 are approximately coincident, indicating that a bias applied to the drain has no effect on the drain current control gate voltage relationship. Consequently, according to an embodiment of the present invention, no drain edge defects are present.

It is to be appreciated that embodiments of the present invention are well suited to a variety of methods of representing drain current versus gate voltage information, and that it is not necessary to physically construct a plot or graph to practice embodiments of the present invention. Visual plots are well suited to describe embodiments of the present invention to those skilled in the art. However, other forms of information storage and comparison, including direct numerical calculation of values and/or automatic comparisons by computer, are well suited to embodiments of the present invention.

The preferred embodiment of the present invention a method of detecting and distinguishing stack gate edge defects at the source or drain junction. While the present invention has been described in particular embodiments, it should be appreciated that the present invention should not be construed as limited by such embodiments, but rather construed according to the below claims.

What is claimed is:

1. A computer implemented method of testing a semiconductor device comprising a stacked floating gate structure, a source, a drain and a control gate, said method comprising;

a) programming said floating gate;

b) applying an electrical stress voltage to said control gate with said source in a source condition and said drain in a drain condition;

c) measuring a drain current gate voltage relationship for said semiconductor subsequent to said applying;

d) repeating a), b) and c) with said source in a second source condition or said drain in a second drain condition;

repeating d) until said electrical stress voltage has been applied;

while said drain has been grounded while said source has had a negative and a positive bias voltage relative to said drain; and while said source has been grounded and said drain has had a negative and a positive bias voltage relative to said source; and identifying a gate stack defect on a source side if said drain current gate voltage relationship information collected after electrical stress applications with said drain grounded show different behavior between positive bias and negative bias applied to said source.

2. A computer implemented method of testing a semiconductor device comprising a stacked floating gate structure, a source, a drain and a control gate, said method comprising;

a) programming said floating gate;

b) applying an electrical stress voltage to said control gate with said source in a source condition and said drain in a drain condition;

c) measuring a drain current gate voltage relationship for said semiconductor subsequent to said applying;

d) repeating a), b) and c) with said source in a second source condition or said drain in a second drain condition;

repeating d) until said electrical stress voltage has been applied;

while said drain has been grounded while said source has had a negative and a positive bias voltage relative to said drain; and while said source has been grounded and said drain has had a negative and a positive bias voltage relative to said source;

identifying a gate stack defect on a source side if said drain current gate voltage relationship information collected after electrical stress applications with said drain grounded show different behavior between positive bias and negative bias applied to said source; and taking a corrective action based on said identifying.

3. A computer implemented method of testing a semiconductor device comprising a stacked floating gate structure, a source, a drain and a control gate, said method comprising;

a) programming said floating gate;

b) applying an electrical stress voltage to said control gate with said source in a source condition and said drain in a drain condition;

c) measuring a drain current gate voltage relationship for said semiconductor subsequent to said applying;

d) repeating a), b) and c) with said source in a second source condition or said drain in a second drain condition;

repeating d) until said electrical stress voltage has been applied;

while said drain has been grounded while said source has had a negative and a positive bias voltage relative to said drain; and while said source has been grounded and said drain has had a negative and a positive bias voltage relative to said source; and identifying a gate stack defect on a drain side if said drain current gate voltage relationship information collected after electrical stress applications with said source grounded show different behavior between positive bias and negative bias applied to said source.

4. A computer implemented method of testing a semiconductor device comprising a stacked floating gate structure, a source, a drain and a control gate, said method comprising:

a) programming said floating gate;

b) applying an electrical stress voltage to said control gate with said source in a source condition and said drain in a drain condition;

c) measuring a drain current gate voltage relationship for said semiconductor subsequent to said applying;

d) repeating a) b) and c) with said source in a second source condition or said drain in a second drain condition;

repeating d) until said electrical stress voltage has been applied;

while said drain has been grounded while said source has had a negative and a positive bias voltage relative to said drain; and while said source has been grounded and said drain has had a negative and a positive bias voltage relative to said source;

identifying a gate stack defect on a drain side if said drain current gate voltage relationship information collected after electrical stress applications with said source show different behavior between positive bias and negative bias applied source; and taking a corrective action based on said identifying.

* * * * *